United States Patent [19]

Nulman

[11] Patent Number: 5,236,868
[45] Date of Patent: Aug. 17, 1993

[54] FORMATION OF TITANIUM NITRIDE ON SEMICONDUCTOR WAFER BY REACTION OF TITANIUM WITH NITROGEN-BEARING GAS IN AN INTEGRATED PROCESSING SYSTEM

[75] Inventor: Jaim Nulman, Palo Alto, Calif.

[73] Assignee: Applied Materials, Inc., Santa Clara, Calif.

[21] Appl. No.: 511,652

[22] Filed: Apr. 20, 1990

[51] Int. Cl.$^5$ .......................................... H01L 21/283
[52] U.S. Cl. .................................... 437/190; 437/192; 437/200
[58] Field of Search .................... 357/67, 71; 437/192, 437/200, 190; 204/298.25, 192

[56] References Cited

U.S. PATENT DOCUMENTS

| | | | |
|---|---|---|---|
| 4,379,832 | 4/1983 | Dalal et al. | 437/175 |
| 4,545,115 | 10/1985 | Bauer et al. | 437/946 |
| 4,585,517 | 4/1986 | Stemple | 437/946 |
| 4,676,866 | 6/1987 | Tang et al. | 156/643 |
| 4,785,962 | 11/1988 | Toshima | 220/260 |
| 4,855,798 | 8/1989 | Imamura et al. | 357/71 |

FOREIGN PATENT DOCUMENTS 0157025 9/1985 European Pat. Off. .

OTHER PUBLICATIONS

Alperin, M. E., *IEEE Transactions on Electron Devices*, vol. ED-32, No. 2, Feb. 1985, pp. 141-149.
Ahmah, S., et al., *Thin Solid Films*, 143 (1986), 155-162.
Adams, E. D., et al., *J. Vac. Sci. Technol.* A3(6), Nov./Dec. 1985, pp. 2264-2267.
Morgan, A. E., et al. *Rapid Thermal Processing*, MRS 1986, pp. 279-287.
Tang, T. E., et al., *IEEE Transaction on Electron Devices*, vol. ED-34, No. 3, Mar. 1987, pp. 682-688.
Bomchil, G., et al., *Thin Solid Films*, 140(1986), 59-70.

Primary Examiner—T. N. Quach
Attorney, Agent, or Firm—John P. Taylor

[57] ABSTRACT

A process is disclosed for forming a layer of titanium nitride on a semiconductor wafer which comprises forming a titanium layer on the wafer in a vacuum deposition chamber in the substantial absence of oxygen-bearing gases; transferring the titanium coated wafer to a sealed annealing chamber without substantially exposing the newly formed titanium layer to oxygen-bearing gases; annealing the titanium-coated semiconductor wafer in a nitrogen-bearing atmosphere in the sealed annealing chamber, and in the substantial absence of oxygen-bearing gases, at an annealing temperature of from 400° C. up to below about 650° C. to form a titanium nitride compound on the wafer; and further annealing the wafer at a temperature of from about 800° C. to about 900° C. to form a stable phase of stoichiometric titanium nitride (TiN) on the wafer. The resulting layer of titanium nitride may be patterned to form local interconnects on the wafer, as well as to provide barrier portions between underlying titanium silicide and metal contacts such as aluminum. In a preferred embodiment, the initial annealing temperature ranges from about 400° C. up to below about 600° C. whereby substantially all of the titanium will react with the nitrogen to form titanium nitride on the wafer.

14 Claims, 5 Drawing Sheets

```
┌─────────────────────────────────────────────────┐
│ CLEANING A SILICON SEMICONDUCTOR WAFER IN A     │
│ CLEANING CHAMBER USING ONE OR MORE REACTIVE     │
│ GASES WITH AN RF PLASMA                         │
└─────────────────────────────────────────────────┘
                        │
┌─────────────────────────────────────────────────┐
│ MOVING THE CLEANED WAFER TO A VACUUM DEPOSITION │
│ CHAMBER WITHOUT EXPOSING THE CLEANED WAFER TO   │
│ OXYGEN-BEARING GASES                            │
└─────────────────────────────────────────────────┘
                        │
┌─────────────────────────────────────────────────┐
│ DEPOSITING A LAYER OF TITANIUM ON THE CLEANED   │
│ SEMICONDUCTOR WAFER                             │
└─────────────────────────────────────────────────┘
                        │
┌─────────────────────────────────────────────────┐
│ MOVING THE WAFER FROM THE VACUUM DEPOSITION     │
│ CHAMBER TO AN ANNEALING CHAMBER WITHOUT         │
│ EXPOSING THE COATED WAFER                       │
│ TO OXYGEN-BEARING GASES                         │
└─────────────────────────────────────────────────┘
                        │
┌─────────────────────────────────────────────────┐
│ ANNEALING THE COATED WAFER IN A NITROGEN-BEARING│
│ ATMOSPHERE AT A FIRST TEMPERATURE OF FROM ABOUT │
│ 400° C TO BELOW ABOUT 650° C FOR A PERIOD OF FROM│
│ ABOUT 20 SECONDS TO 60 SECONDS TO FORM          │
│ TITANIUM NITRIDE ON THE WAFER                   │
└─────────────────────────────────────────────────┘
                        │
┌─────────────────────────────────────────────────┐
│ RAISING THE WAFER TEMPERATURE TO FROM ABOUT     │
│ 800° C TO ABOUT 900° C TO CONVERT THE TITANIUM  │
│ NITRIDE TO A STABLE PHASE                       │
└─────────────────────────────────────────────────┘
                        │
┌─────────────────────────────────────────────────┐
│ ETCHING THE WAFER TO PATTERN THE                │
│ TITANIUM NITRIDE LAYER                          │
└─────────────────────────────────────────────────┘
```

Figure 12

FORMATION OF TITANIUM NITRIDE ON SEMICONDUCTOR WAFER BY REACTION OF TITANIUM WITH NITROGEN-BEARING GAS IN AN INTEGRATED PROCESSING SYSTEM

BACKGROUND OF THE INVENTION

1. Field of the Invention

This invention relates to a process for forming a titanium nitride layer on a semiconductor wafer by annealing a titanium layer, already deposited on the wafer, in a nitrogen-bearing atmosphere under reaction conditions which favor formation of titanium nitride.

2. Description of the Related Art

In the conventional formation of a titanium silicide layer, as a part of an integrated circuit structure on a semiconductor wafer such as a silicon wafer, a titanium layer is first deposited over a silicon semiconductor wafer. The silicide is then formed during an anneal by the reaction between the titanium and underlying exposed silicon regions of the wafer. The reaction is carried out in a sealed chamber in the presence of nitrogen gas which results in the simultaneous formation of a surface layer of titanium nitride over the titanium silicide which serves as a barrier layer to prevent migration of unreacted silicon atoms through the titanium silicide layer to the surface.

The silicide-forming anneal is usually carried out at a temperature within a range of from about 650° C. to about 695° C., at which temperature range, formation of titanium silicide will readily occur. Higher temperatures are usually avoided because those portions of the titanium layer overlying silicon oxide ($SiO_2$) regions of the semiconductor wafer may react with the silicon oxide to form both titanium oxide and titanium silicide, the presence of neither of which is desirable over the silicon oxide (insulation or isolation) regions of the wafer.

Temperatures below about 650° C. have usually been avoided in the prior art because the presence of oxides on the titanium usually inhibited formation of either the titanium silicide or the barrier layer of titanium nitride unless a temperature of at least 650° C. was used. In particular, the presence of oxides usually inhibited the adequate penetration of nitrogen into the layer to form the desired titanium nitride blocking layer required to inhibit silicon migration to the surface. This can be seen in the Rutherford Backscattering Profile of FIG. 1 which illustrates the inadequate nitrogen penetration when a prior art silicide anneal process was carried out at 625° C. after the titanium surface had been exposed to air.

Such oxides are conventionally present due to the prior art practice of conventionally depositing a layer of titanium over a cleaned wafer structure in a vacuum deposition chamber, for example, using a vacuum sputtering deposition (PVD) process, to deposit about 100 to about 1000 Angstroms of titanium on the wafer, and then removing the titanium-coated wafer from the deposition chamber and transporting it through the ambient atmosphere to separate annealing apparatus, resulting in the pick-up of oxygen and/or oxygen-bearing gases, such as air, on the surface of the newly deposited titanium layer.

In addition, oxides might also be present in prior art practices due to inadequate wafer cleaning practices. Although those surfaces of the wafer on which the titanium silicide layer was to be formed were first cleaned in prior art practices to remove any materials which might interfere with reaction between the subsequently deposited titanium layer and the exposed silicon portions of the wafer, the conventional cleaning was usually carried out in a vacuum chamber using an inert gas such as argon with an rf plasma (either with or without a previous oxide wet etch), after which the cleaned wafer was usually transported through the ambient atmosphere to the deposition chamber. This exposure of the cleaned wafer to oxygen-bearing gases, as well as the inadequacies of the inert gas/rf plasma cleaning, provided additional sources of oxides and other impurities on the wafer surface.

It would, however, be desirable to provide a process for the annealing of a titanium layer on a semiconductor wafer under conditions where penetration of nitrogen into the titanium layer would occur, even while annealing at a temperature at which the formation of titanium nitride instead of titanium silicide would be favored.

SUMMARY OF THE INVENTION

It is, therefore, an object of this invention to provide a process for the formation of a layer of titanium nitride on a semiconductor wafer.

It is another object of this invention to provide a process for the formation of a conductive layer of titanium nitride on a semiconductor wafer wherein oxygen is sufficiently excluded from the process to permit forming the titanium nitride at a temperature below about 650° C..

It is yet another object of this invention to provide a process for the formation of a conductive layer of titanium nitride on a semiconductor wafer wherein oxygen is sufficiently excluded from the process to permit forming the titanium nitride at an initial annealing temperature of from about 400° C. up to below about 650° C. followed by an anneal at from 800° C. to about 900° C. to form a stable stoichiometric titanium nitride (TiN).

It is still another object of this invention to provide a process for the formation of a conductive layer of titanium nitride on a semiconductor wafer wherein oxygen is sufficiently excluded from the process to permit forming a layer of substantially only titanium nitride on the wafer at an initial annealing temperature of from about 400° C. up to below about 600° C. followed by an anneal at from 800° C. to about 900° C. to form a stable stoichiometric titanium nitride (TiN).

It is a further object of this invention to provide a process for the formation of a conductive layer of titanium nitride on a semiconductor wafer wherein oxygen is sufficiently excluded from the process to permit forming the titanium nitride at an initial annealing temperature of from about 400° C. up to below about 650° C. to thereby permit formation of titanium silicide over exposed silicon portions of the wafer and a layer of titanium nitride over the entire wafer which can be used as a local interconnect and/or as a barrier layer between the titanium silicide and aluminum subsequently deposited over the titanium nitride layer.

It is still a further object of this invention to provide a process for the formation of titanium nitride on a semiconductor wafer wherein oxygen-bearing gases are sufficiently excluded from the process to permit forming the titanium nitride at an initial annealing temperature below about 650° C. to thereby permit formation of a layer of titanium nitride over the entire wafer, wherein the oxygen-bearing gases are excluded by transferring the wafer from a titanium deposition chamber to an annealing chamber without exposing the titanium coated wafer to oxygen-bearing gases which would inhibit penetration of nitrogen atoms into the layer or inhibit the formation of titanium nitride.

It is yet a further object of this invention to provide a process for the formation of a titanium nitride layer on a semiconductor wafer wherein oxygen-bearing gases such as air are further excluded from the process by cleaning the wafer using a reactive rf ion etch prior to depositing a layer of titanium on the wafer; transferring the wafer from the cleaning chamber to a titanium deposition chamber under vacuum without exposing the titanium coated wafer to oxygen-bearing gases; then transferring the wafer from the titanium deposition chamber to an annealing chamber under vacuum without exposing the titanium coated wafer to oxygen-bearing gases; then initially annealing the wafer at a temperature below about 650° C. to form a titanium nitride compound; and then annealing the structure at from 800° C. to about 900° C. to form a stable stoichiometric titanium nitride (TiN).

These and other objects of the invention will be apparent from the following description and accompanying drawings.

BRIEF DESCRIPTION OF THE DRAWINGS

FIG. 12 is a flow sheet illustrating the process of the invention.

DETAILED DESCRIPTION OF THE INVENTION

Figure 1:
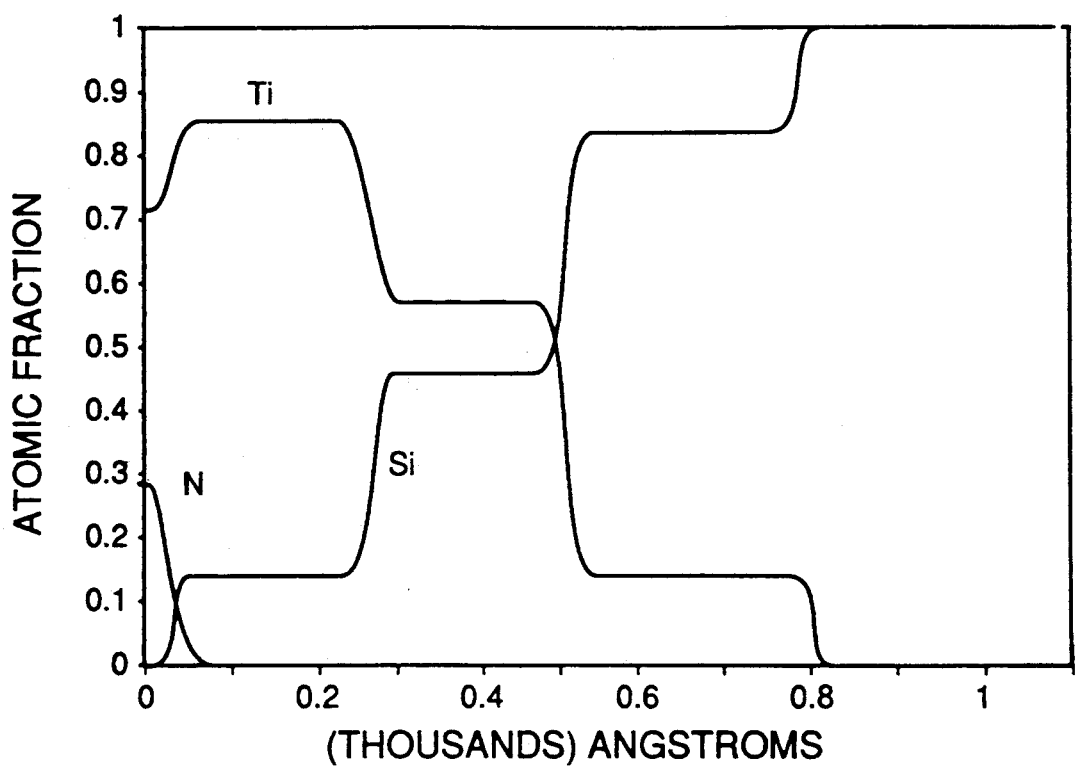
FIG. 1 is a graph showing the concentration of nitrogen, titanium, and silicon plotted against depth for a prior art process.

The process of the invention comprises the formation of a titanium nitride layer on a semiconductor wafer, by contacting a titanium layer with a nitrogen-bearing gas, in the substantial absence of oxygen-bearing gases, at a temperature below about 650° C.

In one embodiment, the process comprises the formation of a titanium nitride layer on a semiconductor wafer, by contacting a titanium layer with a nitrogen-bearing gas, in the substantial absence of oxygen-bearing gases, at a temperature below about 600° C. to react substantially all of the titanium on the wafer to form titanium nitride.

By use of the term "below about 650° C.", is meant a temperature not exceeding about 649° C., and preferably not exceeding about 645° C. By use of the term "below about 600° C.", is meant a temperature not exceeding about 599° C., and preferably not exceeding about 595° C.

By use of the expressions herein "substantial absence of oxygen-bearing gas" and/or "without substantially exposing the newly formed titanium layer to oxygen and/or oxygen-bearing gases" is meant that in the chambers respectively used for the titanium deposition and for annealing, as well as in the vacuum chamber used for the transfer of the wafer therebetween, the atmosphere will contain less than 10 ppm oxygen in any of the chambers.

By use of the term herein "a nitrogen-bearing atmosphere" is meant an atmosphere containing at least 10 volume % nitrogen. The nitrogen may come from $N_2$ or from any other nitrogen-containing source which will decompose to provide a source of nitrogen without adding oxygen-bearing gases to the atmosphere, e.g., $NH_3$.

In one aspect, the process of the invention includes the transfer of the semiconductor wafer, under vacuum and in the substantial absence of oxygen-bearing gases, from a titanium deposition chamber and to an annealing chamber, to inhibit or exclude oxygen in and/or on the newly formed titanium layer on the semiconductor wafer during the annealing portion of the process, which permits formation of titanium nitride within the recited temperatures ranges.

In another aspect the process of the invention further includes the cleaning of the wafer, prior to the titanium deposition step, using a reactive rf ion etch to more thoroughly remove any contaminants which might interfere with the process from the wafer surface prior to the titanium deposition step, followed by moving the cleaned wafer from the cleaning chamber to the titanium deposition chamber without exposing the wafer to oxygen-bearing gases, then transferring the semiconductor wafer, under vacuum and in the substantial absence of oxygen-bearing gases, from the deposition chamber to the annealing chamber, to inhibit or exclude oxygen in and/or on the newly formed titanium layer on the semiconductor wafer during the annealing portion of the process, to permit formation of titanium nitride within the recited temperature ranges.

To further exclude oxygen-bearing gases from the process, the wafer may be subject to a degassing step prior to the cleaning step. The process of forming a titanium silicide layer on a semiconductor wafer, in the substantial absence of oxygen and/or oxygen-bearing gases such as air, is described and claimed in copending U.S. patent application Ser. No. 07/510,307; filed Apr. 16, 1990; assigned to the assignee of this invention and entitled "INTEGRATED PROCESSING SYSTEM FOR FORMING TITANIUM SILICIDE ON SEMICONDUCTOR WAFER", cross-reference to which is hereby made. In that application there is described a process for forming titanium silicide on a semiconductor wafer, including a blocking layer of titanium nitride over the titanium silicide to inhibit migration of unreacted silicon to the surface, wherein oxygen-bearing gases are excluded by the transfer of the semiconductor wafer, under vacuum and in the substantial absence of oxygen-bearing gases, from a titanium deposition chamber to an annealing chamber, as well as by the cleaning of the wafer, prior to the titanium deposition step, using a reactive rf ion etch to more thoroughly remove oxygen and/or oxygen-bearing gases from the wafer surface prior to the titanium deposition step, followed by transfer of the cleaned wafer, under vacuum and in the substantial absence of oxygen-bearing gases, to the titanium deposition chamber. The initial annealing temperature used in that process ranges from about 600° C. to about 695° C. and the titanium nitride blocking layer is then subsequently removed either before or after a higher temperature anneal which converts the titanium silicide into a more stable phase.

The formation of a titanium nitride blocking layer on a semiconductor wafer, during the course of forming a titanium silicide layer, is also described and claimed in copending U.S. patent application Ser. No. 07/509,928, filed Apr. 16, 1990; assigned to the assignee of this invention and entitled "LOW NITROGEN PRESSURE PROCESS FOR FORMING TITANIUM SILICIDE ON SEMICONDUCTOR WAFER", cross-reference to which is hereby made; and in copending U.S. patent application Ser. No. 07/510,340; filed Apr. 16, 1990; U.S. Pat. No. 5,043,300, assigned to the assignee of this invention and entitled "SINGLE ANNEAL STEP PROCESS FOR FORMATION OF TITANIUM SILICIDE ON SEMICONDUCTOR WAFER", cross-reference to which is also hereby made.

In Ser. No. 07/509,938, the annealing step is carried out while maintaining a nitrogen vacuum or pressure level of from about 100 milliTorr to about 100 Torr, preferably from about 500 milliTorr to about 10 Torr, and most preferably from about 1 Torr to about 10 Torr. In Ser. No. 07/510,340 the initial annealing may be carried out at a lower temperature range of from about 500° C. to about 695° C. for about 20 to about 60 seconds, followed by a further anneal for an additional 20 to 60 seconds at a higher temperature of from about 800° C. to about 900° C. without first removing the titanium nitride blocking layer, followed by the conventional etch step to selectively remove the titanium nitride layer. While the aforementioned applications all discuss the formation of a titanium nitride layer in conjunction with the forming of a titanium silicide layer over silicon portions of the wafer, in each case subsequent removal of the titanium nitride layer is also described because the function of the titanium nitride layer in those applications is merely to facilitate formation of the titanium silicide layer by forming a titanium nitride blocking layer to prevent migration of silicon to the surface, as well as to inhibit reaction between the silicon oxide ($SiO_2$) portions of the wafer and unreacted titanium thereon during the subsequent higher temperature anneal.

In the process of the present invention, the purpose is to form a conductive layer of titanium nitride on the wafer which may function as a local interconnect on the wafer, a function which titanium silicide cannot be used for since this necessitates forming a conductive layer over insulating portions of the wafer, i.e., over silicon oxide portions where silicon is not available to react with the titanium layer to form titanium silicide. The titanium nitride layer formed by the process of the present invention may also be used as a barrier layer between titanium silicide and an aluminum layer, e.g., as an underlying layer for an aluminum wiring harness over silicon as well as over silicon oxide portions of the wafer.

Figure 2:
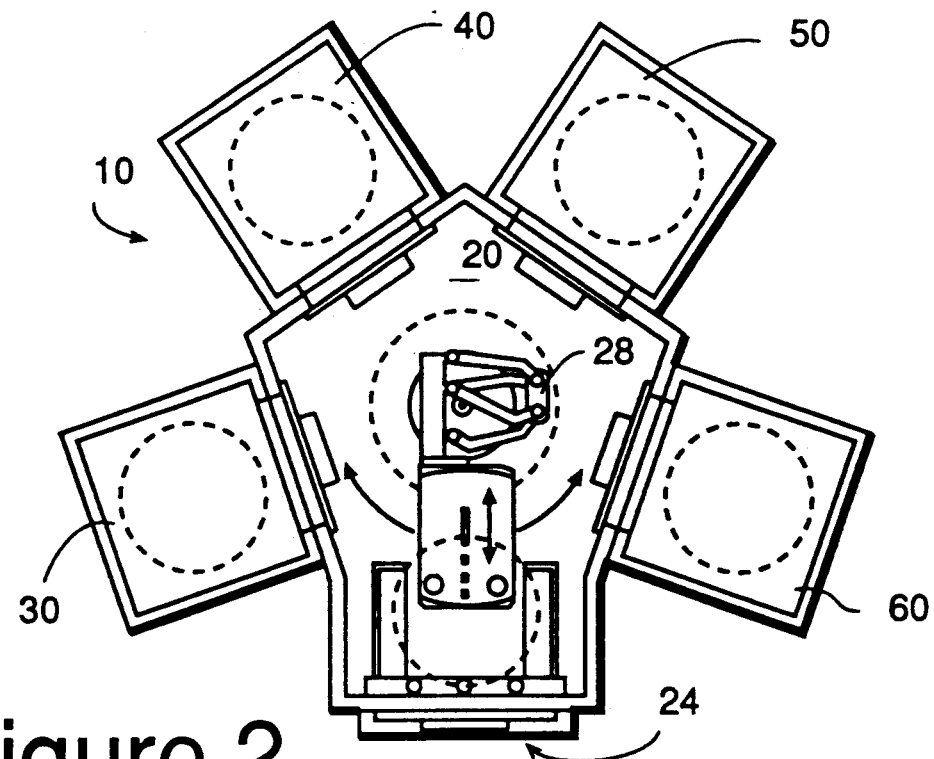
FIG. 2 is a top view of an apparatus suitable for carrying out the process of the invention.
Figure 3:
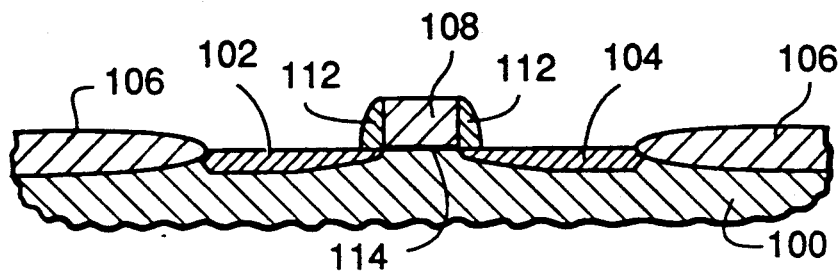
FIGS. 3-7 are sequential fragmentary vertical cross-sectional views illustrating formation of a titanium nitride interconnect on a silicon wafer using the process of the invention.

Turning now to FIG. 2, apparatus useful for carrying out the process of the invention is generally indicated at 10 which comprises a sealed central chamber 20 into which a wafer may be loaded through a cassette load lock 24. Central chamber 20 may be maintained at a vacuum ranging from about $10^{-9}$ to about $10^{-5}$ Torr. In particular, oxygen and other oxygen-bearing gases such as air are excluded from central chamber 20.

Robotic means 28 may be provided within central chamber 20 to transfer the wafer between a cleaning chamber 30, a PVD chamber 40, and an annealing chamber 50 through central chamber 20. An optional degassing chamber 60 may also be provided as a part of apparatus 10, which will also be accessible through central vacuum chamber 20.

Multi-chambered vacuum apparatus for the processing of semiconductor wafers is generally described in Toshima U.S. Pat. No. 4,785,962, cross-reference to which is hereby made, and is commercially available, such as, for example, a 5000 Series wafer processing apparatus available from Applied Materials, Inc. in Santa Clara, Calif., and such apparatus may be modified for the practice of the present invention.

In the practice of the process of the invention, a single wafer or a group of wafers on a tray is admitted into central chamber 20 of vacuum apparatus 10 through load lock 24. A wafer may then be optionally transferred to degassing chamber 60 where any gases, including oxygen-bearing gases, will be removed. Such a degassing step would be carried out for from about 10 to 180 seconds at a temperature of from about 50° C. to about 300° C. in a degassing chamber maintained at a vacuum of from about $10^{-5}$ to about $10^{-9}$ Torr.

The degassed wafer is transferred through central chamber 20 to cleaning chamber 30 where the wafer is cleaned to remove any foreign materials from the wafer and, in particular, any oxides from the surface of the exposed silicon.

The wafer may be cleaned using a conventional inert gas RF etch, using argon as the inert gas. However, in accordance with a preferred embodiment of the process of the invention, the wafer is preferably cleaned using a reactive rf ion process such as a $NF_3$/argon mixture by flowing into cleaning chamber 30 from about 2 sccm to about 500 sccm of at least one reactive gas such as $NF_3$ and from about 10 sccm to about 1000 sccm of a carrier gas such as argon while maintaining a vacuum of from about 1 to about 50 milliTorr in cleaning chamber 30 and an rf plasma at a power level ranging from about 20 to about 500 watts. The cleaning chamber is maintained at a temperature within a range of from about 27° C. to about 200° C. during the cleaning step which is carried out for a period of from about 1 to about 500 seconds.

Examples of reactive gases which can be used to carry out the reactive ion etch cleaning step of the invention include not only $NF_3$, but also fluorinated 1-2 carbon hydrocarbons such as, for example, $CHF_3$ and $CF_4$, as well as mixtures of same.

After the wafer has been cleaned, it is transferred out of cleaning chamber 30 back to central chamber 20 and then into deposition chamber 40 where a layer of titanium, having a thickness range of from about 100 to about 5000 Angstroms, preferably from about 100 to about 1000 Angstroms, and typically about 500 Angstroms, is conventionally deposited onto the wafer surface using, for example, a PVD sputtering process. It will be noted that in the preferred embodiment of the invention, the cleaned wafer removed from cleaning chamber 30 is not exposed to air or any other oxygen-containing gases, but is rather moved from cleaning chamber 30 through vacuum chamber 20 directly to deposition chamber 40.

After deposition of the titanium layer onto the wafer, the wafer is removed from deposition chamber 40 and, in accordance with the invention, directly transferred to annealing chamber 50 through vacuum chamber 20 without any exposure to oxygen or other oxygen-bearing gases, such as air, which might otherwise adsorb on or enter into the newly deposited titanium layer.

The annealing step of the process is then carried out by first annealing the wafer at a temperature ranging from about 400° C. up to either below about 650° C. or below about 600° C., depending upon whether or not it is desired to also form titanium silicide. If it is desired to convert substantially all of the titanium layer to a titanium nitride compound, for example, where the titanium layer has been applied only over silicon oxide portions of the wafer, or over previously formed titanium silicide, then the upper temperature limit during the first anneal should be below about 600° C. If on the other hand, the titanium layer has been applied over both silicon oxide portions of the wafer, as well as over silicon, then the upper limit of the first anneal should be below about 650° C., so that titanium silicide will form over the silicon portions of the wafer, e.g., between the silicon and the titanium nitride.

By use of the expression "substantially all" with regard to the conversion of the titanium layer to a titanium nitride compound rather than to titanium silicide is meant that at least 80% titanium nitride is formed (by thickness ratio of titanium nitride to titanium silicide) up to as high as 97% titanium nitride, depending upon how low the initial annealing temperature is, with titanium nitride formation being more favored as the initial annealing temperature is lowered.

The annealing step is preferably carried out under rapid anneal conditions where the wafer is ramped up to the initial annealing temperature at a rate of from about 5° C./second to about 150° C./second, typically about 80° C./second, and the wafer is subject to the initial annealing temperature for a period of from about 20 to about 60 seconds. In accordance with the best mode of practicing the invention, the temperature is then raised to from about 800° C. to about 900° C. for an additional period of from about 20 to 60 seconds to convert the titanium nitride compound formed at the first annealing temperature to the more stable stoichiometric titanium nitride (TiN), as is well known to those skilled in this art.

During the annealing step, one or more nitrogen-bearing gases are flowed into annealing chamber 50 at a rate ranging from about 500 to about 10,000 sccm while maintaining the pressure in said annealing chamber within a range of from about 100 milliTorr to about 800 Torr. Lower nitrogen pressures ranges, i.e., of from about 100 milliTorr to about 100 Torr, preferably from about 500 milliTorr to about 10 Torr, and most preferably from about 1 Torr to about 10 Torr, as described in the aforementioned copending application Ser. No. 07/509,928, may also be used in the process of the present invention.

After the annealing step, the resulting titanium nitride layer formed on the wafer may be patterned, for example, photolithographically using a photoresist mask, followed by selective removal of unmasked portions of the titanium nitride layer using any etchant, including a suitable dry etchant process such as a chlorine-containing etch; or using a conventional wet etch such as a mixture of 4 parts by weight $H_2O$, 1 part by weight $H_2O_2$, and 1 part by weight $NH_4OH$ which will remove titanium nitride in preference to titanium silicide and/or silicon oxide.

Referring now to FIGS. 3-7, a silicon semiconductor wafer 100 is shown having silicon oxide ($SiO_2$) isolation regions 106 previously formed in the surface of the wafer and an MOS structure comprising a source region 102, a drain region 104, and a gate electrode 108 formed over gate oxide 114 with oxide spacers 112 formed on the sidewalls of gate electrode 108. In this embodiment, titanium silicide will be formed over the source and drain regions and over the gate electrode, and titanium nitride portions will be formed over the silicide, as well as over oxide portions of the wafer, as a part of the construction of the electrical contacts for the MOS device.

Figure 4:
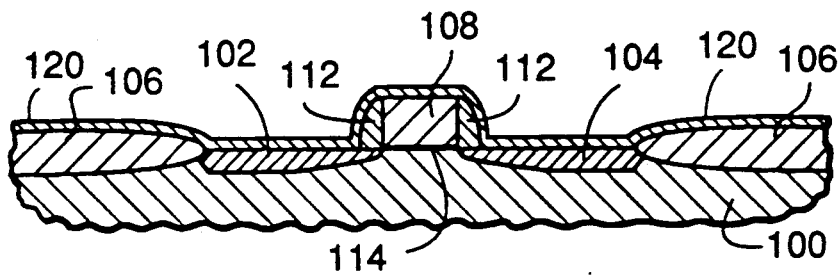

As previously described, the wafer is first cleaned to prepare the surface for deposition of titanium layer 120 which is shown deposited on the wafer structure in FIG. 4. The titanium coated wafer is then moved to an annealing chamber, without exposing the titanium surface to oxygen-bearing gases, where the wafer is first annealed at a temperature of from about 400° C. to below about 650° C. for a period of from about 20 to 60 seconds, followed by a further anneal for an additional period of from about 20 to about 60 seconds to convert the titanium nitride compound formed at the initial annealing temperature to a more stable stoichiometric titanium nitride (TiN), as well as to convert the titanium silicide to a more stable phase.

Figure 5:
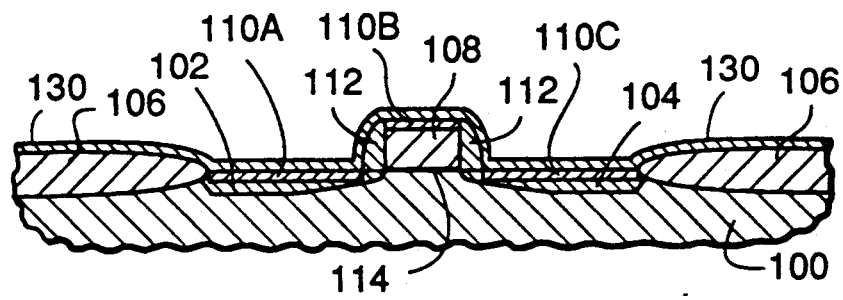

FIG. 5 shows the structure resulting from the annealing step. The titanium in those portions of titanium layer 120 in direct contact with silicon (either single crystal or polycrystalline silicon), i.e., the titanium over source region 102, drain region 104, and gate electrode 108, reacts with the silicon, at the lower annealing temperature, to form titanium silicide, as shown at 110A, 110B, and 110C. A layer of titanium nitride 130 is formed over the entire structure by reaction between titanium layer 120 and the nitrogen-bearing gas present in the annealing chamber.

It should be noted that all of the titanium in those portions of layer 120 overlying isolation oxide regions 106 and oxide spacers 112 reacts with the nitrogen to form titanium nitride at the lower annealing temperature so that when the annealing temperature is then raised, there will be no unreacted titanium over the oxide regions available to react with the silicon oxide at the higher annealing temperature to form titanium silicides and/or titanium oxides over the silicon oxide regions of the structure, since some portions of the titanium nitride layer will not be removed. In view of this, it may be necessary to adjust the initial deposition thickness of the titanium layer to ensure complete reaction of the titanium, depending upon the temperature and time of the anneal.

While it is not the intention to be bound by any theories of operation, the formation of titanium nitride at the recited temperature ranges is thought to be made possible by the exclusion of oxygen-bearing gases from the process which might otherwise form titanium oxides which would interfere with the reaction between nitrogen and the titanium layer.

Figure 6:
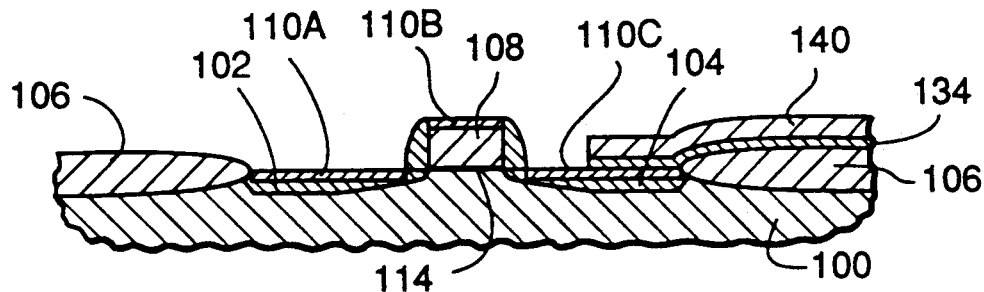
Figure 7:
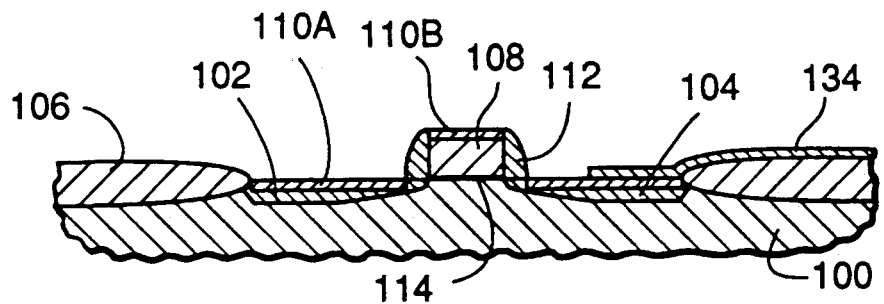
Figure 8:
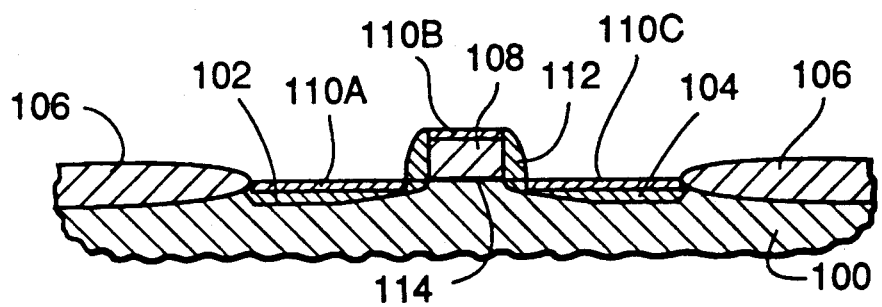
FIGS. 8-11 are sequential fragmentary vertical cross-sectional views illustrating formation of titanium nitride barrier over previously formed titanium silicide portions and under aluminum contacts on a silicon wafer using the process of the invention.

In FIG. 6, a photoresist mask 140 has been formed over a portion of titanium nitride layer 130, and the remainder of layer 130 has been etched away, by an etchant, such as previously described, which will remove titanium nitride, but not titanium silicide or silicon oxide, leaving titanium nitride segment 134 to serve as a local interconnect between silicide portion 110C and another unspecified portion of the integrated circuit structure on wafer 100. Photoresist mask 140 is then removed, leaving the structure shown in FIG. 7.

Turning now to FIGS. 8-11, another embodiment of the process is illustrated wherein titanium nitride segments are used as barrier materials between titanium silicide and an aluminum wiring harness. In the embodiment shown, titanium silicide portions 110A, 110B, and 110C have already been formed, respectively, over source region 102, drain region 104, and gate electrode 108.

Figure 9:
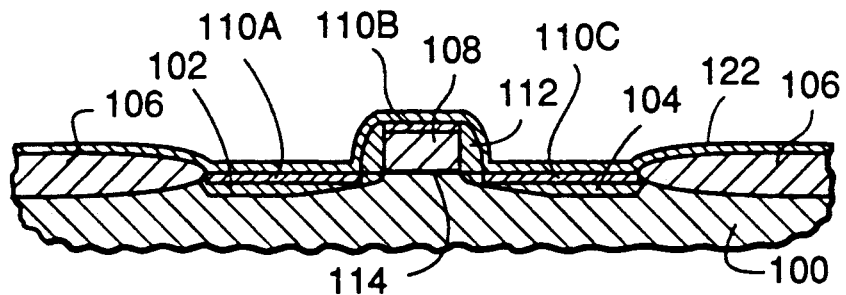

A layer of titanium 122 is deposited over the wafer, as shown in FIG. 9. The structure is then initially annealed in a nitrogen-bearing atmosphere at a temperature of from about 400° C. to below about 600° C., for a period of from about 20 to 60 seconds, to convert the titanium to a titanium nitride compound, followed by a further anneal for an additional period of from about 20 to about 60 seconds to convert the titanium nitride compound initially formed to a more stable stoichiometric titanium nitride (TiN).

Figure 10:
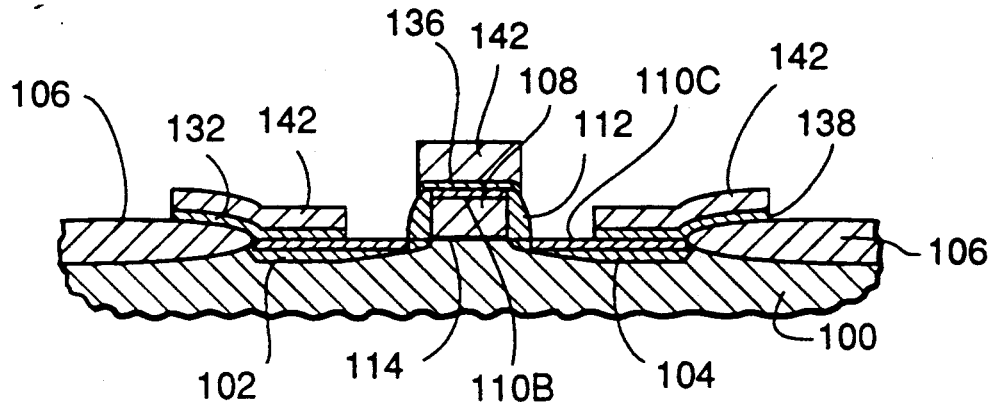

A photoresist mask 142 is then applied over the titanium nitride layer, and the exposed titanium nitride is then dry or wet etched, leaving the structure shown in FIG. 10 with titanium nitride segments 132, 136, and 138, respectively provided over titanium silicide portions 110A, 110B, and 110C.

Figure 11:
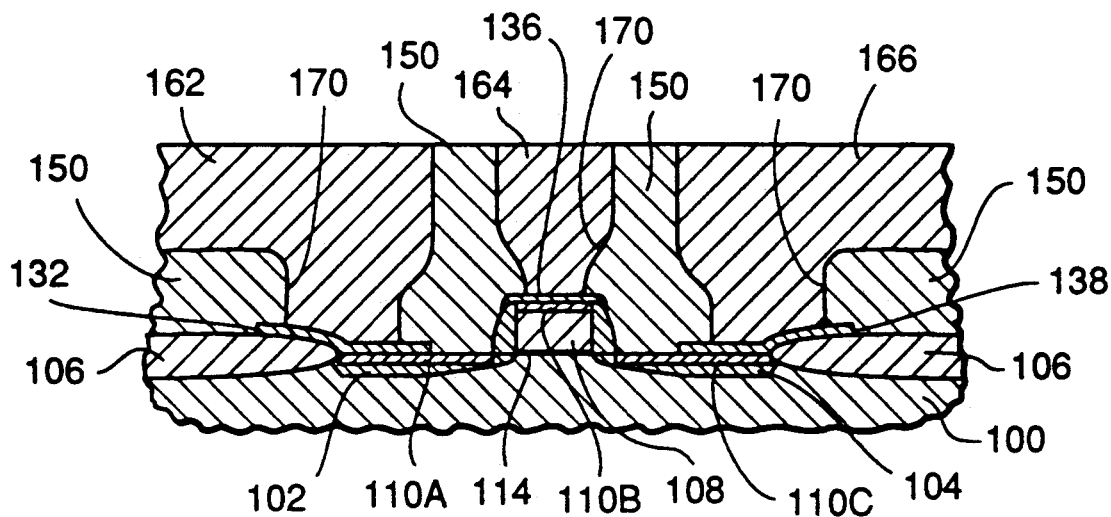

Photoresist mask 142 is then removed, an oxide layer 150 may be formed over the entire structure, and vias 170 may be formed to expose titanium nitride segments 132, 136, and 138. Aluminum connections 162, 164, and 166 may then be made to the respective titanium nitride segments, as shown in FIG. 11.

Thus, the invention provides a process for forming titanium nitride on the surface of a semiconductor wafer at a low initial annealing temperature at which either only titanium nitride, or titanium nitride and titanium silicide will be formed, wherein the titanium nitride may serve as a barrier between titanium silicide and aluminum and/or as a local interconnect on the wafer between various portions of the integrated circuit structures formed thereon. The use of such low annealing temperatures employed to initially form the titanium nitride is made possible by the exclusion of oxygen-bearing gases such as air from the wafer during the processing of the wafer to form the titanium nitride thereon.

Having thus described the invention what is claimed is:

1. A process for forming a layer of substantially all titanium nitride on a semiconductor wafer which comprises:
   a) forming a titanium layer on said wafer in a vacuum deposition chamber in the substantial absence of oxygen-bearing gases;
   b) transferring the titanium coated wafer to a sealed annealing chamber without substantially exposing the newly formed titanium layer to oxygen-bearing gases;
   c) annealing the titanium-coated semiconductor wafer in a nitrogen-bearing atmosphere in said sealed annealing chamber, and in the substantial absence of oxygen-bearing gases, at an initial annealing temperature of from 400° C. up to below about 600° C. for a period of from about 20 to about 60 seconds whereby substantially all of said titanium will react with said nitrogen to form said layer of substantially all titanium nitride on said wafer; and
   d) further annealing said wafer at a temperature of from about 800° C. to about 900° C. to form a stable phase of stoichiometric titanium nitride (TiN) on said wafer.

2. The process of claim 1 including the further steps of masking said titanium nitride layer after said annealing steps, and then selectively removing unmasked portions of said titanium nitride layer to thereby from a conductive titanium nitride pattern on said wafer.

3. The process of claim 1 wherein said nitrogen-bearing atmosphere in said annealing chamber is maintained, during said first annealing step, at a pressure ranging from about 100 milliTorr to about 800 Torr while flowing one or more nitrogen-bearing gases into said chamber at a rate ranging from about 500 to about 10,000 sccm.

4. The process of claim 1 wherein said nitrogen-bearing atmosphere in said annealing chamber is maintained, during said first annealing step, at a pressure ranging from about 500 milliTorr to about 10 Torr.

5. The process of claim 1 which further includes transferring said wafer from said vacuum deposition chamber to said sealed annealing chamber through a sealed central chamber maintained at a pressure ranging from about $10^{-9}$ to about $10^{-5}$ Torr which is interconnected to both said vacuum deposition chamber and said sealed annealing chamber to avoid substantially exposing the newly formed titanium layer to oxygen and/or oxygen-bearing gases, whereby said titanium and said nitrogen will react to form said layer of substantially all titanium nitride within said initial annealing temperature range.

6. The process of claim 5 which comprises the further steps of:
   a) cleaning said wafer in a cleaning chamber using a gaseous mixture which includes at least one reactive gas while maintaining an rf plasma in said cleaning chamber to remove oxides and other materials from the silicon surfaces thereon prior to said titanium deposition step; and
   b) transferring said cleaned wafer from said cleaning chamber to said vacuum deposition chamber without substantially exposing said cleaned wafer to oxygen-bearing gases using a sealed central chamber maintained at a pressure which ranges from about $10^{-9}$ to about $10^{-5}$ Torr which is interconnected to both said cleaning chamber and said vacuum deposition chamber.

7. The process of claim 6 wherein said cleaning step further comprises flowing into said cleaning chamber a gaseous mixture containing at least one reactive gas at a rate of from about 2 to about 500 sccm reactive gas and from about 10 to about 1000 sccm carrier gas while maintaining said plasma at a power ranging from about 20 to about 500 watts for a period of time ranging from about 1 to about 500 seconds.

8. The process of claim 7 including the further step of degassing said wafer, prior to said cleaning step, in a degassing chamber for from about 10 to about 180 seconds at a temperature of from about 50° C. to about 300° C. while maintaining a vacuum of from about $10^{-5}$ to about $10^{-9}$ Torr, and then transferring the degassed wafer to the cleaning chamber without exposing the wafer to oxygen-bearing gases.

9. The process of claim 1 wherein said titanium deposition step further comprises depositing a titanium layer ranging in thickness from about 100 to about 5000 Angstroms.

10. The process of claim 1 including the further step of forming titanium silicide portions over exposed silicon portions of said wafer prior to said step of depositing said titanium layer, whereby initially annealing of said titanium layer within said temperature range of from about 400° C. to below about 600° C. will result in the formation of titanium nitride over said titanium silicide portions, and subsequent patterning of said titanium nitride will form local interconnects between said titanium silicide portions and other parts of an integrated circuit structure formed on said wafer.

11. A process for forming a layer of substantially all titanium nitride on a semiconductor wafer having titanium silicide portions previously formed thereon which comprises:
   a) forming a titanium layer on said wafer and over said previously formed titanium silicide portions thereon in a vacuum deposition chamber in the substantial absence of oxygen-bearing gases;
   b) transferring the titanium coated wafer to a sealed annealing chamber without substantially exposing the newly formed titanium layer to oxygen-bearing gases;
   c) annealing the titanium-coated semiconductor wafer in a nitrogen-bearing atmosphere in said sealed annealing chamber, and in the substantial absence of oxygen-bearing gases, at an annealing temperature of from 400° C. up to below about 600° C. for a period of from about 20 to about 60 seconds whereby substantially all of said titanium will react with said nitrogen to form said layer of substantially all titanium nitride on said wafer;
   d) further annealing said wafer at a temperature of from about 800° C. to about 900° C. for a period of from about 20 to about 60 seconds to form a stable phase of stoichiometric titanium nitride (TiN) on said wafer;
   e) masking said titanium nitride layer after said annealing steps; and
   f) then selectively removing unmasked portions of said titanium nitride layer to thereby form a conductive titanium nitride pattern on said wafer.

12. The process of claim 11 wherein said nitrogen-bearing atmosphere in said annealing chamber is maintained, during said first annealing step, at a pressure ranging from about from about 1 Torr to about 10 Torr.

13. The process of claim 11 wherein said step of transferring the titanium coated wafer to an annealing station without substantially exposing the newly formed titanium layer to oxygen-bearing gases further comprises transferring said wafer through a sealed central chamber which is interconnected to both said vacuum deposition chamber and said sealed annealing chamber.

14. A process for forming a layer of substantially all titanium nitride on a semiconductor wafer which comprises:
   a) cleaning said wafer in a cleaning chamber for a period of time ranging from about 1 to about 500 seconds by flowing into the chamber a gaseous mixture containing at least one reactive gas at a rate of from about 2 to about 500 sccm reactive gas and from about 10 to about 1000 sccm carrier gas while maintaining a plasma at a power ranging from about 20 to about 500 watts;
   b) transferring said cleaned wafer from said cleaning chamber to a vacuum deposition chamber without substantially exposing said cleaned wafer to oxygen-bearing gases using a sealed central chamber maintained at a pressure which ranges from about $10^{-9}$ to about $10^{-5}$ Torr which is interconnected to both said cleaning chamber and said vacuum deposition chamber;
   c) forming a titanium layer on said wafer in said vacuum deposition chamber in the substantial absence of oxygen-bearing gases;
   d) transferring the titanium coated wafer to a sealed annealing chamber without substantially exposing the newly formed titanium layer to oxygen-bearing gases;
   e) annealing the titanium-coated semiconductor wafer in a nitrogen-bearing atmosphere in said sealed annealing chamber, and in the substantial absence of oxygen-bearing gases, at an annealing temperature of from 400° C. up to below about 600° C. for a period of from about 20 to about 60 seconds whereby substantially all of said titanium will react with said nitrogen to form said layer of substantially all titanium nitride on said wafer;
   f) further annealing said wafer at a temperature of from about 800° C. to about 900° C. for a period of from about 20 to about 60 seconds to form a stable phase of stoichiometric titanium nitride (TiN) on said wafer;
   g) masking said titanium nitride layer after said annealing steps; and
   h) then selectively removing unmasked portions of said titanium nitride layer to thereby form a conductive titanium nitride pattern on said wafer.

* * * * *